(12) United States Patent
Ohmi

(10) Patent No.: US 11,652,013 B2
(45) Date of Patent: May 16, 2023

(54) SENSOR DEVICE WITH DIAGNOSIS UNIT FOR SELF-DIAGNOSING PRESENCE OR ABSENCE OF A FAILURE

(71) Applicant: DENSO CORPORATION, Kariya (JP)

(72) Inventor: Tetsuya Ohmi, Kariya (JP)

(73) Assignee: DENSO CORPORATION, Kariya (JP)

( * ) Notice: Subject to any disclaimer, the term of this patent is extended or adjusted under 35 U.S.C. 154(b) by 0 days.

(21) Appl. No.: 17/836,119

(22) Filed: Jun. 9, 2022

(65) Prior Publication Data

US 2022/0301960 A1 Sep. 22, 2022

Related U.S. Application Data

(63) Continuation of application No. 16/910,160, filed on Jun. 24, 2020, now Pat. No. 11,373,917.

(30) Foreign Application Priority Data

Jun. 26, 2019 (JP) .............................. JP2019-118325

(51) Int. Cl.
*G01R 33/09* (2006.01)
*H01L 23/31* (2006.01)
*H01L 23/495* (2006.01)

(52) U.S. Cl.
CPC .......... *H01L 23/3107* (2013.01); *G01R 33/09* (2013.01); *H01L 23/49517* (2013.01)

(58) Field of Classification Search
CPC ...................................................... G01R 33/09
See application file for complete search history.

(56) References Cited

U.S. PATENT DOCUMENTS

| | | | |
|---|---|---|---|
| 9,306,077 B2* | 4/2016 | Yamazaki | H01L 29/66742 |
| 11,517,238 B2* | 12/2022 | Rogers | A61N 1/0587 |
| 2018/0231618 A1 | 8/2018 | Ohta et al. | |
| 2019/0152524 A1 | 5/2019 | Fujita et al. | |
| 2022/0032955 A1* | 2/2022 | Xiang | G06V 20/56 |

FOREIGN PATENT DOCUMENTS

| | | |
|---|---|---|
| JP | 2014-077683 A | 5/2014 |
| JP | 2018-146483 A | 9/2018 |
| WO | 2018/230087 A1 | 12/2018 |

* cited by examiner

*Primary Examiner* — Alesa Allgood
(74) *Attorney, Agent, or Firm* — Posz Law Group, PLC

(57) ABSTRACT

A sensor device includes: a first sensor element; a second sensor element; and a processing chip that includes a semiconductor substrate, a first processor that receives a first detection signal and processes the first detection signal, a second processor that receives the second detection signal and processes the second detection signal, and an isolation portion that electrically isolates the first processor the second processor. The first processor includes a first diagnosis unit that self-diagnoses a presence or absence of a failure. The second processor includes a second diagnosis unit that self-diagnoses a presence or absence of a failure. The processing chip identifiably outputs a first output of the first processor and a second output of the second processor.

12 Claims, 9 Drawing Sheets

SENSOR DEVICE WITH DIAGNOSIS UNIT FOR SELF-DIAGNOSING PRESENCE OR ABSENCE OF A FAILURE

CROSS REFERENCE TO RELATED APPLICATIONS

The present application is a continuation application of U.S. Utility application Ser. No. 16/910,160 filed on Jun. 24, 2020, which claims the benefit of priority from Japanese Patent Application No. 2019-118325 filed on Jun. 26, 2019, the disclosures of which are incorporated herein by reference.

TECHNICAL FIELD

The present disclosure relates to a sensor device.

BACKGROUND

A sensor device includes a sensor element for detecting a physical quantity, and a processor for processing an output of the sensor element.

SUMMARY

A sensor device may include: a first sensor element; a second sensor element; and a processing chip that may include a semiconductor substrate, a first processor that may receive a first detection signal and process the first detection signal, a second processor that may receive the second detection signal and process the second detection signal, and an isolation portion that may electrically isolate the first processor the second processor. The first processor may include a first diagnosis unit that may self-diagnose a presence or absence of a failure. The second processor may include a second diagnosis unit that may self-diagnose a presence or absence of a failure. The processing chip may identifiably output a first output of the first processor and a second output of the second processor.

BRIEF DESCRIPTION OF DRAWINGS

The above and other features and advantages of the present disclosure will become more apparent from the following detailed description made with reference to the accompanying drawings. In the drawings.

DETAILED DESCRIPTION

Figure 1:
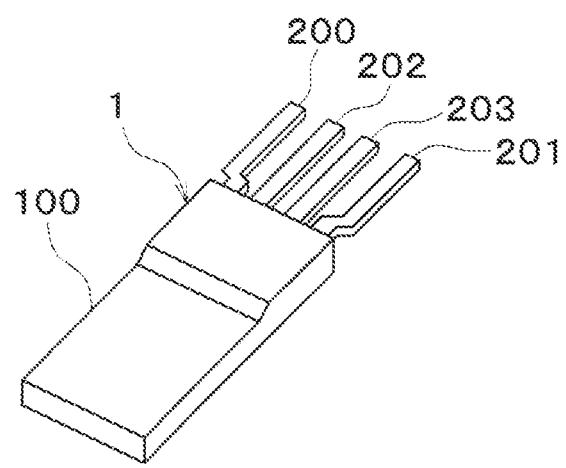
FIG. 1 is an external view of a sensor device according to a first embodiment.

Generally, a sensor device includes a sensor element for detecting a physical quantity, and a processor for processing an output of the sensor element. In the above configuration, when the sensor element or the processor fails, the output of the sensor device cannot be obtained. Therefore, in a comparative example, a dual-system sensor device includes a first sensor unit and a second sensor unit.

The first sensor unit includes a first sensor element and a first processor. The first sensor unit is configured as one chip. Similarly, the second sensor unit includes a second sensor element and a second processor. The second sensor unit is configured as one chip. In other words, the first sensor unit and the second sensor unit have the same configuration. The first sensor unit and the second sensor unit are packaged together.

As described above, the dual-system sensor device is configured such that even when an abnormality occurs in any one of the sensor units, a normal value can be output from the other sensor unit.

However, in the comparative example, each sensor unit does not have a self-diagnosis function for diagnosing the presence or absence of a failure. Each sensor unit is electrically independent. For that reason, when an abnormality occurs in one of the sensor units, it is unclear which of the sensor units outputs a normal value. Accordingly, it may be difficult to continuously perform an operation using a normal sensor output at an output destination of the sensor device.

Therefore, it may be conceivable to provide each sensor unit with a self-diagnosis function. As a result, when an abnormality occurs, the output destination of the sensor device can be notified of the failure. However, since multiple high-function chips are required, the cost of the sensor device is increased.

On the other hand, it may be conceivable to form two processors into one chip. In this case, two processors are formed on one semiconductor substrate. However, since the respective processors are electrically connected to each other through the semiconductor substrate, there is a possibility that the respective systems may fail at the same time or malfunction may occur at the same time due to noise. In order to avoid such a possibility, it has become common general knowledge to secure redundancy by combining multiple chips having a self-diagnosis function together.

One example of the present disclosure provides a sensor device capable of ensuring redundancy without increasing costs and enabling continuous operation of an output destination of a sensor output even when an abnormality occurs.

According to one example embodiment, a sensor device includes a first sensor element that detects a physical quantity of a detection target and outputs a first detection signal and a second sensor element that detects the physical quantity of the detection object and outputs a second detection signal.

The sensor device further includes a processing chip. The processing chip includes a semiconductor substrate, a first processor, a second processor, and an isolation portion.

The first processor is formed in the semiconductor substrate, receives the first detection signal from the first sensor element, and processes the first detection signal. The second processor is formed in the semiconductor substrate, receives the second detection signal from the second sensor element, and processes the second detection signal. The isolation portion is formed in the semiconductor substrate by a semiconductor process, and electrically isolates the first processor the second processor from each other.

The first processor includes a first diagnoses unit. The first diagnosis unit self-diagnoses a presence or absence of a failure in the first sensor element or the first processor. The second processor includes a second diagnosis unit. The self-diagnoses a presence or absence of a failure in the second sensor element or the second processor.

The processing chip identifiably outputs a first output of the first processor based on a diagnosis result of the first diagnosis unit and a second output of the second processor based on a diagnosis result of the second diagnosis unit to an outside. For example, since the output includes identification information, the outside can identify the output.

According to the above configuration, in one processing chip, the first processor and the second processor are electrically isolated from each other by the isolation portion. For that reason, since two processing chips are unnecessary, the redundancy of the sensor device can be ensured without increasing the cost.

The processing chip outputs the first output of the first processor and the second output of the second processor so as to be distinguishable from each other. For that reason, it can be distinguished whether the output destination is the first output of the first processor or the second output of the second processor. Therefore, the output destination is not an output in which an abnormality has occurred, and a normal output can be selectively adopted. Therefore, even when an abnormality occurs, the continuous operation of the output destination of the sensor output can be performed.

Embodiments of the present disclosure will be described below with reference to the drawings. In the following embodiments, the same or equivalent parts are denoted by the same reference numerals in the drawings.

First Embodiment

Hereinafter, a first embodiment will be described with reference to the drawings. A sensor device according to the present embodiment detects a physical quantity of a detection target. The detection target is, for example, a gear incorporated in a crank angle determination device of an internal combustion engine or a transmission in a vehicle. In other words, the sensor device detects rotation of the gear as a detection target.

As shown in FIG. 1, a sensor device 1 is configured as a mold body in which a part of a power supply terminal 200, a part of a ground terminal 201, a part of a first output terminal 202, and a part of a second output terminal 203 are exposed from a mold resin portion 100.

The power supply terminal 200 is a terminal to which a power supply (V) is supplied. The ground terminal 201 is a terminal to which the ground (G) is supplied. The first output terminal 202 and the second output terminal 203 are terminals to which signals of the sensor device 1 are output. Although not shown, a capacitor for removing noise is connected between the power supply terminal 200 and the first output terminal 202, between the first output terminal 202 and the second output terminal 203, and between the second output terminal 203 and the ground terminal 201. In other words, three capacitors are provided in the sensor device 1.

Although not shown, a bottomed cylindrical cap portion is inserted into the mold resin portion 100 on a side opposite to the power supply terminal 200 and the like. As a result, the sensor device 1 and the cap portion are integrated together. A main portion of the sensor device 1 is located in a hollow portion of the cap portion.

The sensor device 1 and the cap portion are accommodated in a case. The case has a tip portion on the gear side, a flange portion fixed to a peripheral mechanism, and a connector portion to which a harness is connected. The sensor device 1 and the cap portion are located at the tip portion of the case. The case is fixed to the peripheral mechanism through the flange portion so that the tip portion of the case has a predetermined gap with respect to a detection surface of the gear. Therefore, the gear moves with respect to the sensor device 1.

Figure 2:
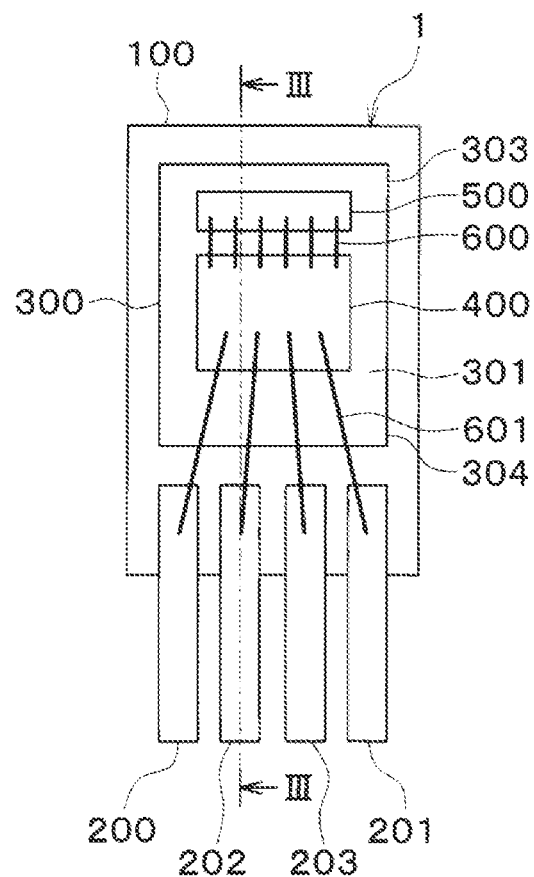
FIG. 2 is a transparent plan view of the sensor device shown in FIG. 1.
Figure 3:
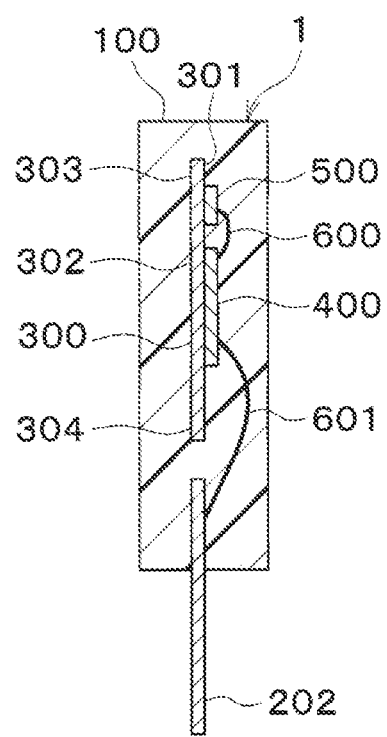
FIG. 3 is a cross-sectional view taken along a line III-III of FIG. 2.

As shown in a schematic plan view of FIG. 2 and a schematic cross-sectional view of FIG. 3, the sensor device 1 includes a lead frame 300, a processing chip 400, and a sensor chip 500 in addition to the mold resin portion 100 and the terminals 200 to 203 described above.

The lead frame 300 is a plate-like metal component having a front surface 301 and a back surface 302. The front surface 301 of the lead frame 300 is disposed in parallel to a gap direction with respect to the gear.

The processing chip 400 and the sensor chip 500 are mounted on the front surface 301 of the lead frame 300 by an adhesive or the like. Specifically, the sensor chip 500 is mounted on the front surface 301 of a first end 303 of the lead frame 300. The first end 303 of the lead frame 300 is oriented toward the gear. The processing chip 400 is mounted between the first end 303 of the front surface 301 of the lead frame 300 and a second end 304 opposite the first end 303.

The processing chip 400 includes a circuit for processing a signal of the sensor chip 500. The sensor chip 500 includes a magnetoresistive element whose resistance value changes when the sensor chip 500 is influenced by a magnetic field from the outside. The magnetoresistive element is, for example, AMR (Anisotropic Magneto Resistance), GMR (Giant Magneto Resistance), or TMR (Tunneling Magneto Resistance). The processing chip 400 and the sensor chip 500 are electrically connected to each other through multiple wires 600.

Each of the terminals 200 to 203 is disposed adjacent to the second end 304 of the lead frame 300 so as to be separated from the lead frame 300. The terminals 200 to 203 and the processing chip 400 are electrically connected to each other through multiple wires 601. The mold resin portion 100 seals the sensor chip, the processing chip 400, the lead frame 300, and a part of each of the terminals 200 to 203 on the second end 304 side of the lead frame 300, and the wires 600 and 601.

Figure 4:
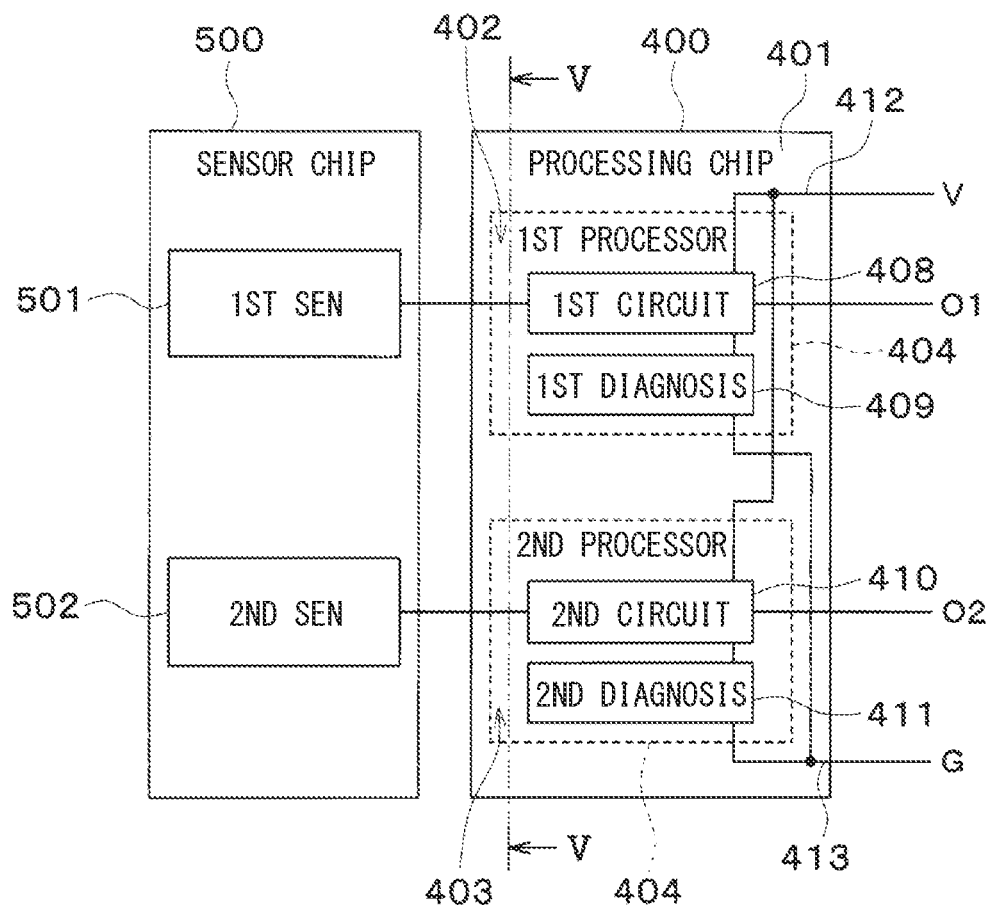
FIG. 4 is a block diagram showing a circuit configuration of the sensor device.

Next, the circuit configurations of the sensor chip 500 and the processing chip 400 will be described. As shown in FIG. 4, the sensor chip 500 includes a first sensor element 501 and a second sensor element 502. The first sensor element 501 detects a physical quantity of the detection target and outputs a first detection signal. The second sensor element 502 detects a physical quantity of the detection target and outputs a second detection signal. Each of the sensor elements 501 and 502 has the same configuration and outputs the same detection signal. The term of "sensor element" may be also referred to as "SEN" in the drawings. The term of "unit"

may be omitted in the drawings. The term of "first" may be also referred to as "1ST" in the drawings. The term of "second" may be also referred to as "2ND" in the drawings.

Each of the sensor elements 501 and 502 employs a magnetic detection method using the magnetoresistive element. For that reason, each of the sensor elements 501 and 502 detects a magnetic change received from the outer peripheral portion of the gear as the rotational position of the gear changes due to the rotation of the gear. Specifically, each of the sensor elements 501 and 502 outputs a signal corresponding to the position of the unevenness in accordance with the rotation of the gear. Each of the sensor elements 501 and 502 is disposed with a predetermined gap with respect to the outer peripheral portion of the gear in the gap direction. The gap direction is a radial direction of the gear.

A magnetoresistive element for detecting a magnetic vector has an advantage that an accuracy error caused by a gap deviation can be canceled. In addition, there is an advantage that the influence of a stress generated in the sensor chip 500 can be reduced or canceled. Therefore, a high-accuracy detection can be performed.

The processing chip 400 is an electronic component that processes detection signals input from the sensor elements 501 and 502. The processing chip 400 is configured as ASIC (Application Specific Integrated Circuit). The processing chip 400 includes a semiconductor substrate 401, a first processor 402, a second processor 403, and an isolation portion 404.

Figure 5:
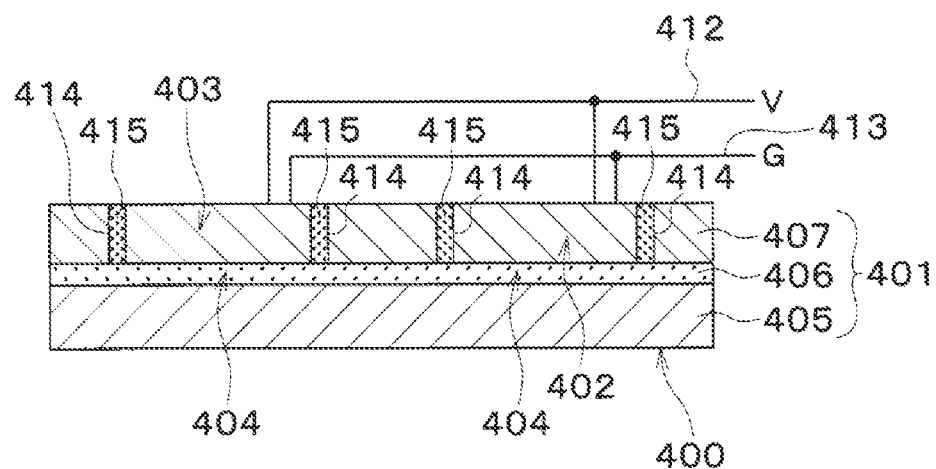
FIG. 5 is a cross-sectional view taken along a line V-V of FIG. 4.

As shown in FIG. 5, the semiconductor substrate 401 includes a first conductive layer 405, an insulation layer 406, and a second conductive layer 407. The insulation layer 406 is formed on the first conductive layer 405. The second conductive layer 407 is formed on the insulation layer 406. In other words, the semiconductor substrate 401 is a lamination substrate in which the first conductive layer 405, the insulation layer 406, and the second conductive layer 407 are laminated on one another.

The first conductive layer 405 and the second conductive layer 407 are made of, for example, single crystal Si. The insulation layer 406 is made of $SiO_2$, for example. In other words, the semiconductor substrate 401 is formed of an SOI substrate. The first processor 402 and the second processor 403 are formed in the second conductive layer 407 by a semiconductor process.

In this example, the semiconductor process is a manufacturing method for forming a semiconductor structure or a circuit element by repeating fine processing on an SOI wafer. An assembling process in which multiple semiconductor chips are mounted on a single board is not the semiconductor process.

The first processor 402 shown in FIG. 4 receives a first detection signal from the first sensor element 501 and performs signal processing. The first processor 402 includes a first circuit unit 408 and a first diagnosis unit 409. The first circuit unit 408 receives the first detection signal from the first sensor element 501, and acquires a rotational position of the gear based on the first detection signal.

The first diagnosis unit 409 self-diagnoses the presence or absence of a failure in the first sensor element 501 or the first processor 402. When detecting no abnormality, the first diagnosis unit 409 permits the first circuit unit 408 to output the first detection signal. When detecting an abnormality, the first diagnosis unit 409 prohibits the output of the first detection signal. The first diagnosis unit 409 changes the output of the first circuit unit 408 to a first abnormality signal.

The second processor 403 includes a second circuit unit 410 and a second diagnosis unit 411. The second circuit unit 410 receives the second detection signal from the second sensor element 502, and acquires the rotational position of the gear based on the second detection signal.

The second diagnosis unit 411 self-diagnoses the presence or absence of a failure in the second sensor element 502 or the second processor 403. When detecting no abnormality, the second diagnosis unit 411 permits the second circuit unit 410 to output the second detection signal. When detecting an abnormality, the second diagnosis unit 411 prohibits the output of the second detection signal. The second diagnosis unit 411 changes the output of the second circuit unit 410 to a second abnormality signal.

The processors 402 and 403 have the same configuration. Therefore, the first sensor element 501 and the first processor 402 configure a first system. The second sensor element 502 and the second processor 403 configure a second system. In other words, the sensor elements 501 and 502 and the processors 402 and 403 configure a double system.

The sensor chip 500 and the processing chip 400 operate based on a power supply supplied from an external device and the ground. In the present embodiment, a common power source and a common ground are supplied to the sensor elements 501 and 502 and the processors 402 and 403. For that reason, the processing chip 400 includes a power supply wiring 412 and a ground wiring 413. The power supply wiring 412 is a wiring for supplying a power supplied to the power supply terminal 200 to the first processor 402 and the second processor 403. The ground wiring 413 supplies the ground supplied to the ground terminal 201 to the first processor 402 and the second processor 403.

The power supply wiring 412 and the ground wiring 413 are formed above the second conductive layer 407. One of the branched power supply wirings 412 is connected to the first processor 402, and the other of the branched power supply wirings 412 is connected to the second processor 403. The same applies to the ground wiring 413. Although not shown, the power supply wiring 412 and the ground wiring 413 are electrically connected to the multiple wires 600, thereby being electrically connected to the sensor elements 501 and 502.

The isolation portion 404 is configured to electrically isolate the first processor 402 and the second processor 403 from each other. As shown in FIGS. 4 and 5, the isolation portion 404 is formed in the semiconductor substrate 401 by a semiconductor process.

Specifically, the isolation portion 404 includes trenches 414 and insulators 415. The trenches 414 are provided in the second conductive layer 407 so as to partition the first processor 402 and the second processor 403 into different regions and reach the insulation layer 406. In other words, the trenches 414 surround a region of the second conductive layer 407 including the first processor 402, and surrounds a region of the second conductive layer 407 including the second processor 403.

The insulators 415 are buried members buried in the trenches 414. The insulators 415 are, for example, BPSG. As a result, in the second conductive layer 407, the region in which the first processor 402 is formed and the region in which the second processor 403 is formed are electrically isolated from each other.

The isolation portion 404 is formed by a semiconductor process as follows. First, an $SiO_2$ layer is deposited on the surface of the second conductive layer 407, and masks having openings corresponding to the trenches 414 are formed. The second conductive layer 407 is etched by use of the mask, to thereby provide the trenches 414 reaching the insulation layer 406. Then, side walls of the trenches 414 are oxidized, and BPSG is buried in the trenches 414 as the insulators 415. Thereafter, BPSG is reflowed, and a surface of the second conductive layer 407 is chemically mechanically polished. The circuit of each of the processors 402 and 403 is formed after the trench isolation process.

In the second conductive layer 407 of the semiconductor substrate 401, regions other than the processors 402 and 403 are partitioned by the trenches 414. A circuit unit having a predetermined function is formed in each compartment.

In the above processing chip 400, an output (O1) of the first processor 402 based on the diagnosis result of the first diagnosis unit 409 is output to the outside through the first output terminal 202. An output (O2) of the second processor 403 based on the diagnosis result of the second diagnosis unit 411 is output to the outside through the second output terminal 203. In other words, the processing chip 400 outputs the outputs of the respective processors 402 and 403 to the outside so as to be identifiable. The sensor device 1 is configured as described above.

As described above, in the present embodiment, the respective processors 402 and 403 are electrically isolated from each other by the isolation portion 404 in one processing chip 400. For that reason, it may be unnecessary to prepare the processors 402 and 403 as dedicated chips. In other words, two processing chips 400 are unnecessary. Therefore, the redundancy of the sensor device 1 can be ensured without increasing the cost.

In this example, usually, when two chips are formed into one chip, there is a need to change the circuit design in accordance with a required specification. For that reason, a chip corresponding to a special specification must be manufactured each time. In other words, in the one-chip configuration of the comparative example, the versatility of the chip is lost. However, in the present embodiment, since each function is electrically isolated from each other by use of the trenches 414, there is no need to consider the special specification in the circuit design. For that reason, the versatility of the processing chip 400 can be enhanced.

The processing chip 400 outputs the output of the first processor 402 and the output of the second processor 403 through the respective output terminals 202 and 203. For that reason, it can be distinguished whether the output destination of the sensor device 1 is the output of the first processor 402 or the output of the second processor 403. In other words, since the output destination can distinguish between the normal detection signal and the abnormality signal, the processing using the detection signal can be continued by selecting the normal output. Therefore, even when the abnormality occurs in the sensor device 1, the continuous operation of the output destination of the sensor output can be enabled.

In the sensor device 1, the sensor chip 500 is disposed at the first end 303 of the lead frame 300. For that reason, each of the sensor elements 501 and 502 can be disposed close to the detection target. In addition, since each of the sensor elements 501 and 502 detects a change in the magnetic field in the plane direction along the gap direction, there is an advantage of employing a configuration in which the sensor chip 500 is mounted on the front surface 301 of the lead frame 300.

Figure 6:
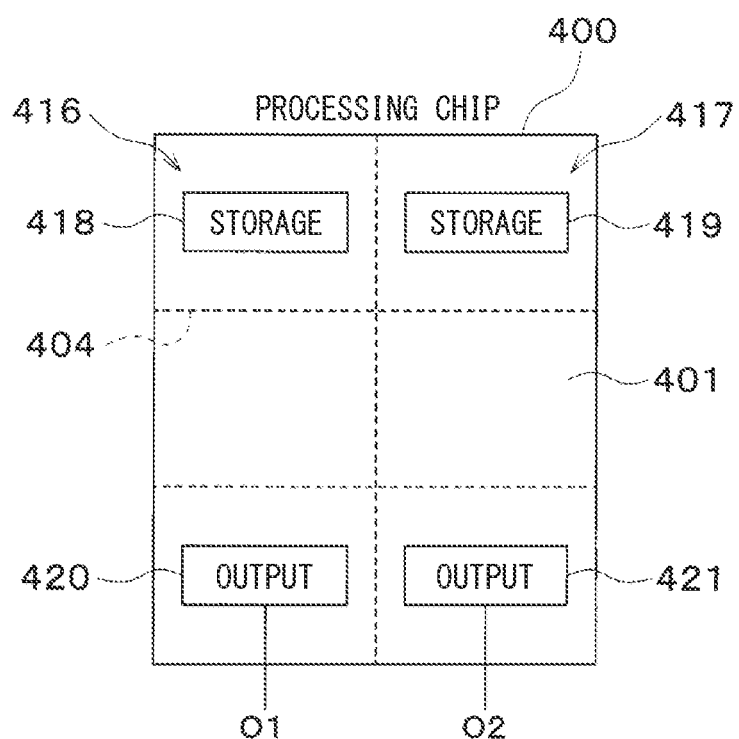
FIG. 6 is a plan view showing a modification of a processing chip according to the first embodiment.

As a modification, as shown in FIG. 6, the processing chip 400 includes a first compartment portion 416, a second compartment portion 417, and storage units 418 and 419.

The first compartment portion 416 is a region of the second conductive layer 407 which is electrically isolated from the first processor 402 and the second processor 403 by the isolation portion 404. The second compartment portion 417 is a region of the second conductive layer 407 which is electrically isolated from the first processor 402, the second processor 403, and the first compartment portion 416 by the isolation portion 404.

The storage units 418 and 419 are memories for storing data. The storage unit 418 is formed in the first compartment portion 416. The storage unit 419 is formed in the second compartment portion 417. The storage units 418 and 419 perform the same function of storing data in both the first compartment portion 416 and the second compartment portion 417, respectively. For example, the storage unit 418 of the first compartment portion 416 stores data related to the first processor 402. The storage unit 419 of the second compartment portion 417 stores data related to the second processor 403.

On the other hand, the storage units 418 and 419 are different in the layout between the first compartment portion 416 and the second compartment portion 417. The different layout means, for example, a case in which the direction of the gate electrode in the first compartment portion 416 is different from that in the second compartment portion 417, a case in which the placement of the circuit configuration is different between the first compartment portion 416 and the second compartment portion 417, or the like.

As another example, as shown in FIG. 6, the processing chip 400 may include output units 420 and 421 in regions partitioned by the isolation portion 404. The output units 420 and 421 are circuit units for outputting the detection signals to the outside. For example, the output unit 420 outputs the first detection signal by a sent communication. The output unit 421 outputs the second detection signal by a PWM communication. The output units 420 and 421 have the same function of outputting a detection signal to the outside, but have completely different circuit configurations.

As described above, a circuit unit having the same function but different layout can be provided in the region partitioned by the isolation portion 404. As a result, the redundancy of the circuit units such as the storage units 418 and 419 and the output units 420 and 421 can be improved.

The storage units 418 and 419 and the output units 420 and 421 may correspond to "function units" of the present disclosure.

Figure 7:
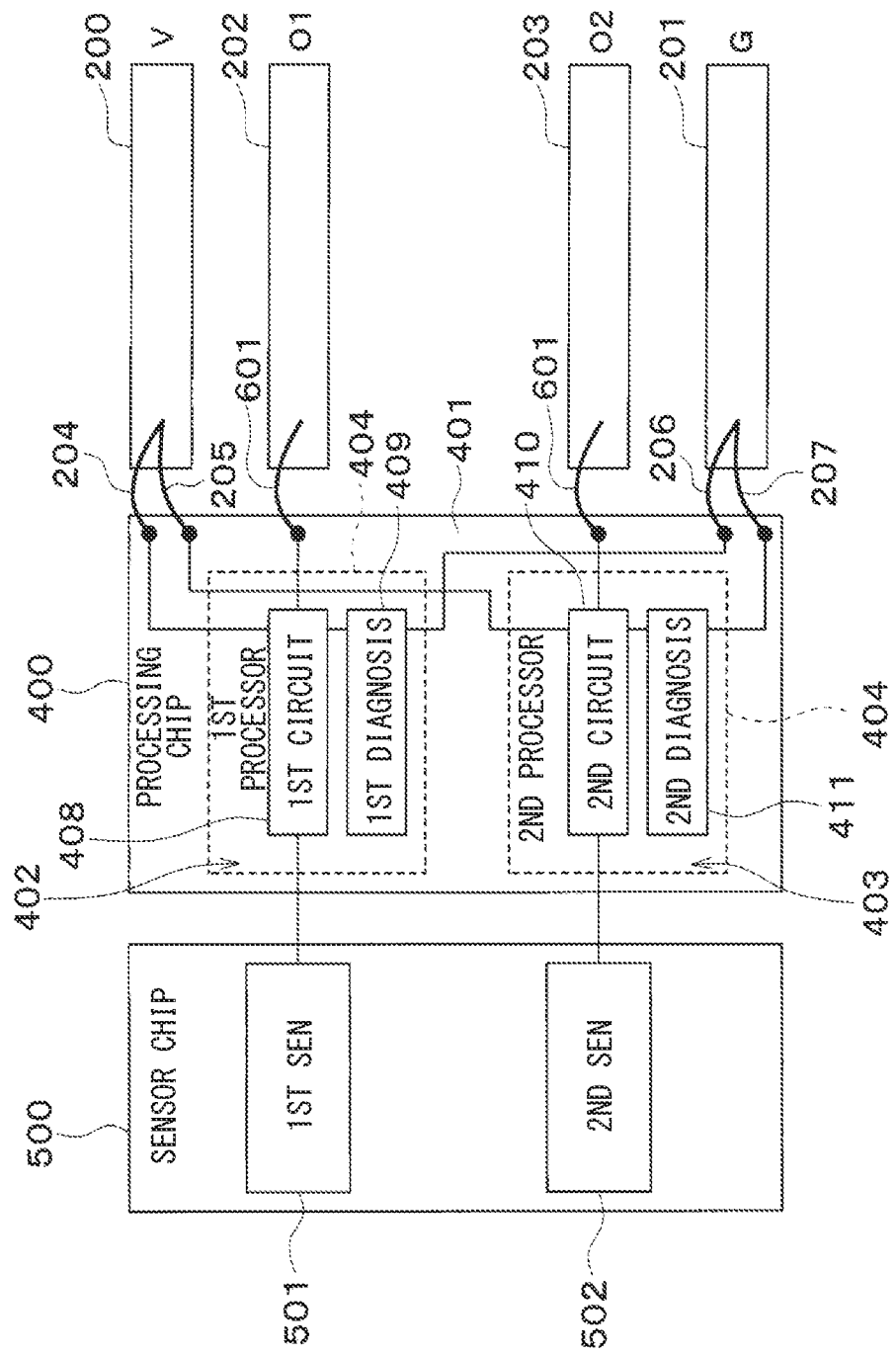
FIG. 7 is a block diagram showing a modification of the sensor device according to the first embodiment.

As a modification, as shown in FIG. 7, the power supply terminal 200 may include a first wire 204 and a second wire 205. In other words, two wires 204 and 205 are connected to one power supply terminal 200. The first wire 204 is electrically connected to the first processor 402. The second wire 205 is electrically connected to the second processor 403.

Similarly, the ground terminal 201 may include a third wire 206 and a fourth wire 207. In other words, two wires 206 and 207 are connected to one ground terminal 201. The third wire 206 is electrically connected to the first processor 402. The fourth wire 207 is electrically connected to the second processor 403.

As a result, a common power supply can be supplied from one power supply terminal 200 to the first processor 402 and the second processor 403 through the first wire 204 and the second wire 205. In addition, a common ground can be supplied from one ground terminal 201 to the first processor 402 and the second processor 403 through the third wire 206 and the fourth wire 207.

Figure 8:
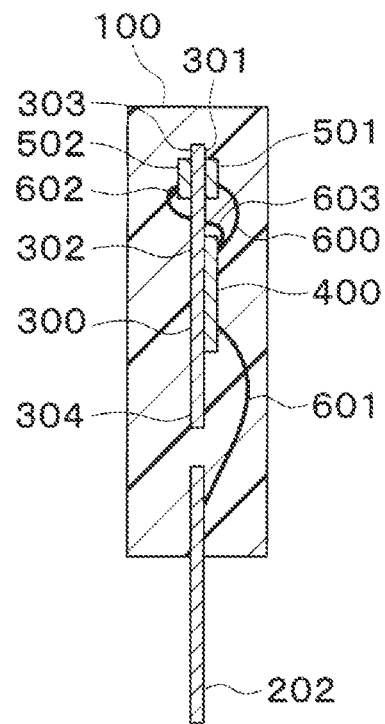
FIG. 8 is a cross-sectional view showing a modification of the sensor device according to the first embodiment.

As a modification, each of the sensor elements 501 and 502 may be formed on a separate chip. As shown in FIG. 8, the first sensor element 501 is mounted on the front surface 301 of the first end 303 of the lead frame 300. On the other hand, the second sensor element 502 is mounted on the back surface 302 of the first end 303 of the lead frame 300. The second sensor element 502 is electrically connected to the second processor 403 by a wire 602 provided on the back surface 302 side of the lead frame 300 and a wire 603 provided on the front surface 301 side of the lead frame 300.

Figure 9:
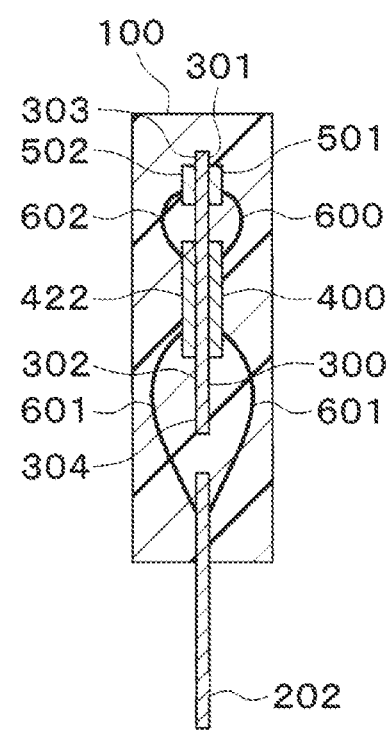
FIG. 9 is a cross-sectional view showing a modification of the sensor device according to the first embodiment.

As a modification, as shown in FIG. 9, another processing chip 422 may be provided on the back surface 302 of the lead frame 300. For example, the second sensor element 502 is electrically connected to another processing chip 422.

Second Embodiment

Figure 10:
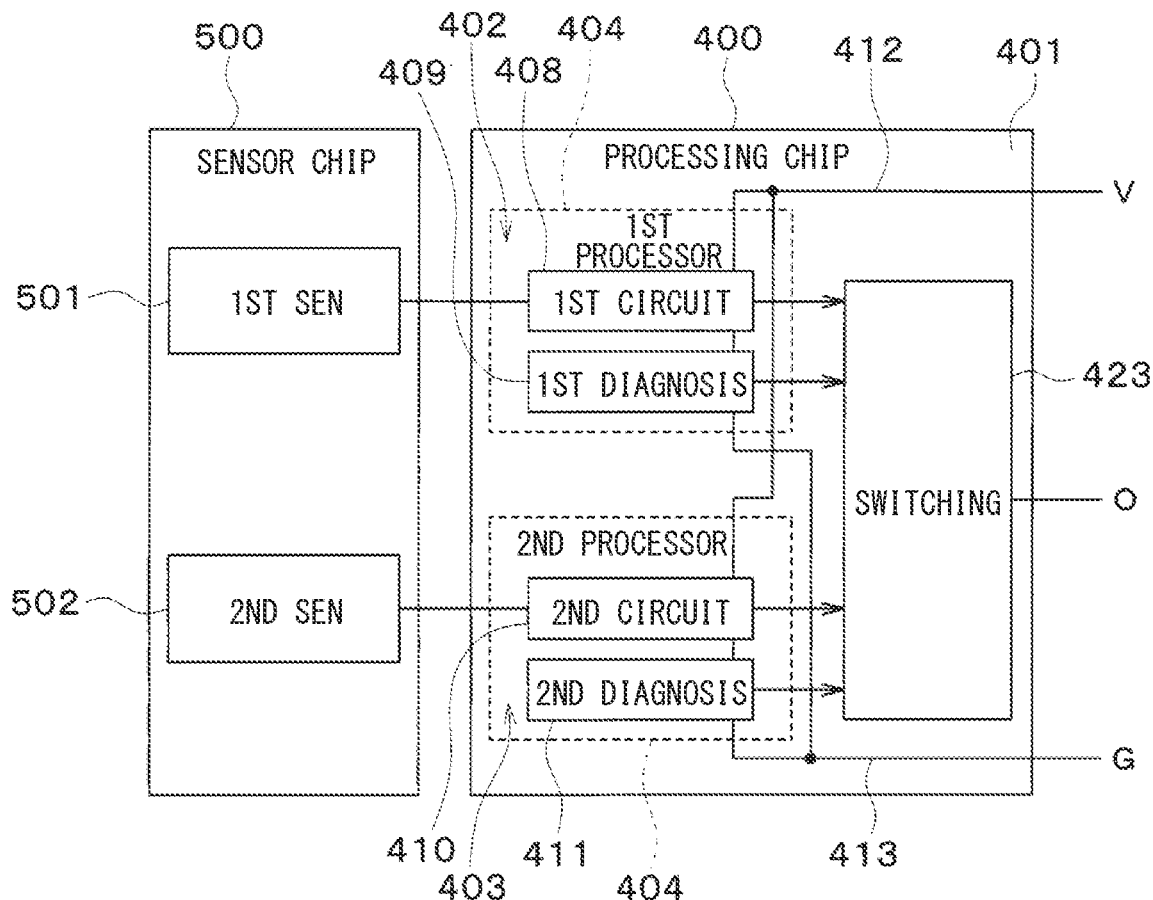
FIG. 10 is a block diagram showing a circuit configuration of a sensor device according to a second embodiment.

In the present embodiment, portions different from those of the first embodiment will be mainly described. As shown in FIG. 10, the processing chip 400 includes a switching unit 423. The switching unit 423 switches between an output of the first processor 402 based on a diagnosis result of the first diagnosis unit 409 and an output of the second processor 403 based on a diagnosis result of the second diagnosis unit 411, and outputs the switched output to the outside.

Figure 11:
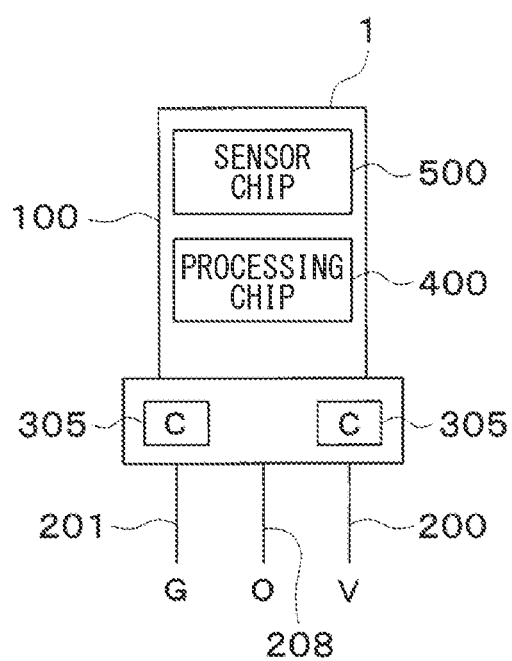
FIG. 11 is a schematic diagram of the sensor device according to the second embodiment.

As a result, the outputs of the respective processors 402 and 403 are not always output, but one of the outputs of the respective processors 402 and 403 is output to the outside by the switching unit 423. In other words, one output (O) is output from the sensor device 1. Therefore, as shown in FIG. 11, the sensor device 1 has one output terminal 208 in addition to the power supply terminal 200 and the ground terminal 201. In other words, although the sensor device 1 has a double-system circuit configuration, the number of terminals of the sensor device 1 can be minimized by including the switching unit 423.

In that case, only two capacitors 305 are required for noise removal. One capacitor 305 is provided between the ground terminal 201 and the output terminal 208. The other capacitor 305 is provided between an output terminal 3 and the power supply terminal 200.

The switching unit 423 alternately outputs the outputs of the respective processors 402 and 403 to the outside when no failure has occurred in the respective systems. When a failure has occurred in any one of the systems, the switching unit 423 continues the output of the system in which no failure has occurred. As a result, the output destination can continue the operation using a normal value.

As a modification, the switching unit 423 may be formed in a region partitioned into the second conductive layer 407 by the isolation portion 404. In this case, the switching unit 423 is electrically connected to the respective processors 402 and 403 by a wiring provided above the second conductive layer 407.

Third Embodiment

Figure 12:
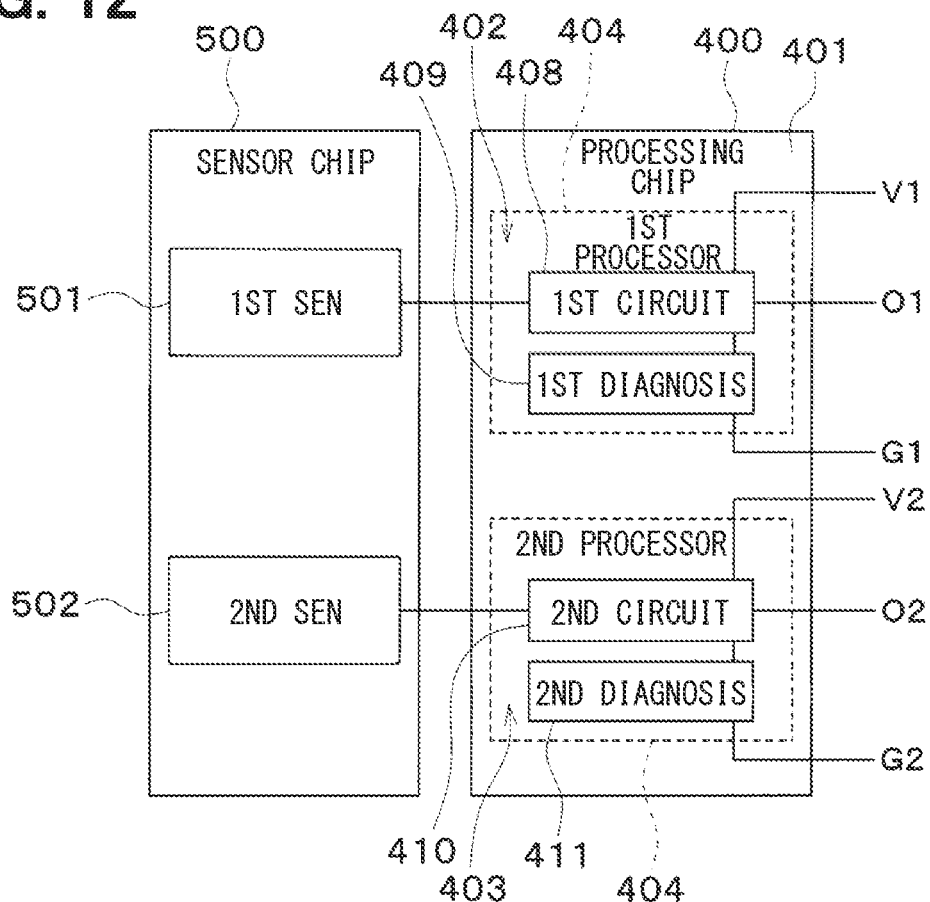
FIG. 12 is a block diagram showing a circuit configuration of a sensor device according to a third embodiment.
Figure 13:
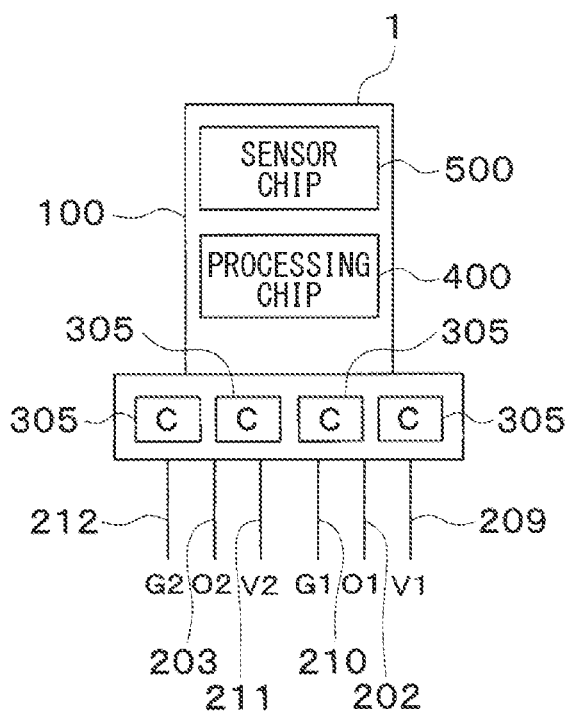
FIG. 13 is a schematic diagram of the sensor device according to the third embodiment.

In the present embodiment, portions different from those of the first embodiment will be mainly described. As shown in FIG. 12, in the present embodiment, the power supply and the ground are provided for each of the processors 402 and 403. For that reason, as shown in FIG. 13, the sensor device 1 includes a power supply terminal 209 (V1), a ground terminal 210 (G1), and the first output terminal 202 (O1) dedicated to the first processor 402. The sensor device 1 has a power supply terminal 211 (V2), a ground terminal 212 (G2), and the second output terminal 203 (O2) dedicated to the second processor 403.

In the present embodiment, four capacitors 305 for removing the noise are provided. The capacitors 305 are connected between the respective terminals 202, 209, and 210. Similarly, the capacitors 305 are connected between the respective terminals 203, 211, and 212.

According to the above configuration, even when the abnormality occurs in the power supply or the ground of any one of the systems, the sensor output can be continuously output from the other system.

As a modification, the sensor device 1 may include the switching unit 423 shown in FIG. 10. Although the power supply terminals 209 and 211 and the ground terminals 210 and 212 are separated from each other in each system, the output terminals can be combined into one.

Fourth Embodiment

Figure 14:
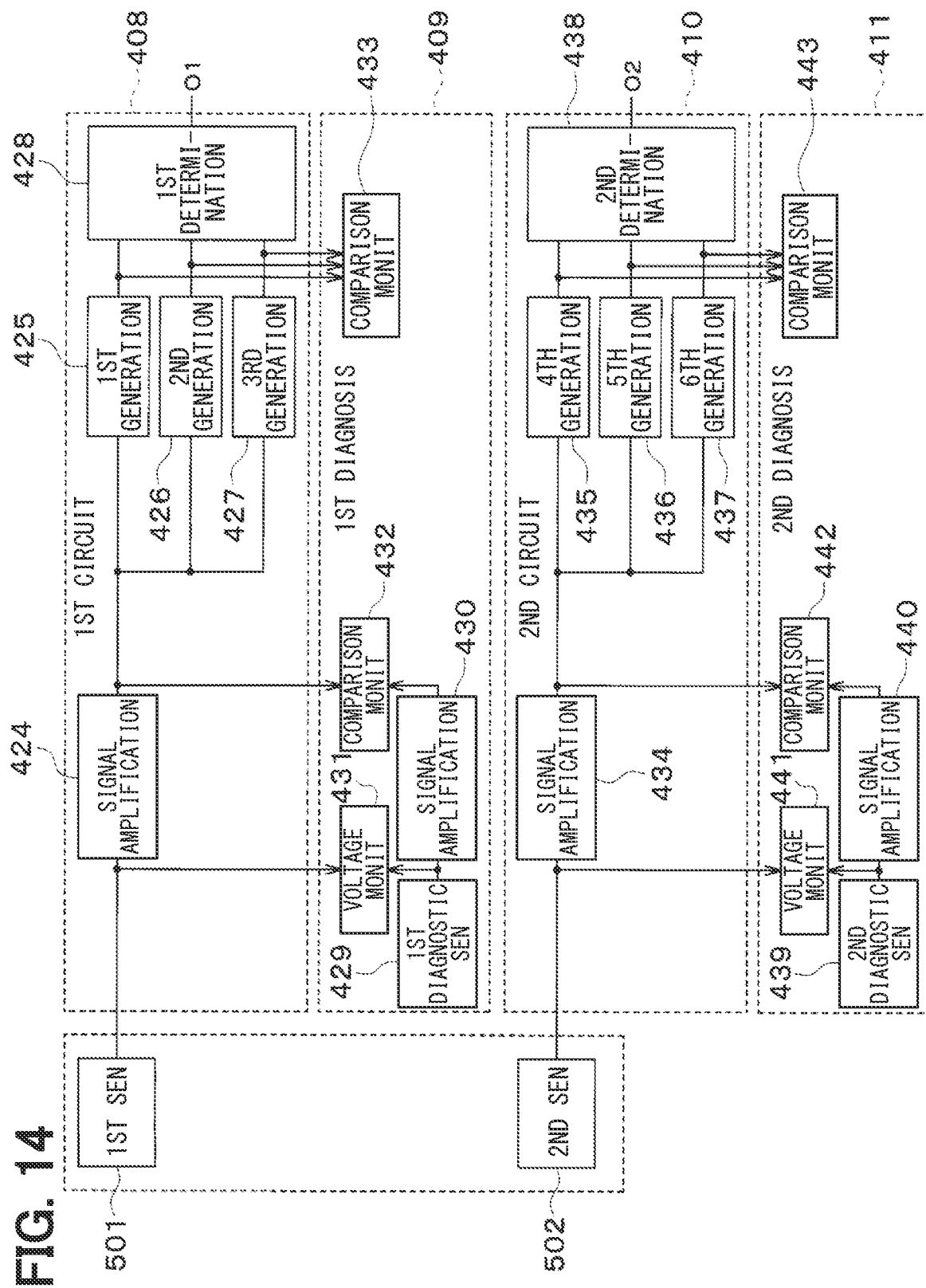
FIG. 14 is a block diagram showing a circuit configuration of a sensor device according to a fourth embodiment.

In the present embodiment, portions different from the respective embodiments described above will be described. As shown in FIG. 14, the first circuit unit 408 of the first processor 402 includes a signal amplification unit 424, a first generation unit 425, a second generation unit 426, a third generation unit 427, and a first determination unit 428. The term of "third" may be also referred to as "3RD" in the drawings.

The signal amplification unit 424 is a circuit unit that receives a first detection signal from a first sensor element 501 and amplifies the signal. The signal amplification unit 424 outputs the processed first detection signal to each of the generation units 425 to 427.

The first generation unit 425 is a circuit unit that receives the first detection signal from the signal amplification unit 424 and generates a first output signal. The second generation unit 426 is a circuit unit that receives the first detection signal from the signal amplification unit 424 and generates a second output signal identical to the first output signal. The third generation unit 427 is a circuit unit that receives the first detection signal from the signal amplification unit 424 and generates a third output signal identical to the first output signal and the second output signal. Each of the generation units 425 to 427 has the same configuration. In other words, the output circuit unit of the first circuit unit 408 is a triple system.

Each of the generation units 425 to 427 generates, for example, a PWM signal as an output signal. Each of the generation units 425 to 427 generates the same PWM signal when no failure occurs in any of the generation units.

The first determination unit 428 is a circuit unit that receives the first output signal, the second output signal, and the third output signal from the respective generation units 425 to 427 and determines which output signal is to be output. The first determination unit 428 takes a majority vote of the signal values of the respective output signals (in other words, selects a majority of a signal value of each of the respective signals), and determines an output signal of the majority signal value as a signal to be output to the outside.

For example, when the PWM signal of the first generation unit 425 is "1", the PWM signal of the second generation unit 426 is "1", and the PWM signal of the third generation unit 427 is "0", the number of signal values of "1" is two, and the number of signal values of "0" is one. In that case, the ration of two to one is obtained, and the PWM signal having the signal value of "1" is a majority. Therefore, the first determination unit 428 outputs the majority of the first output signal or the second output signal to the outside as the sensor output (O1). As a result, the first processor 402 can output a normal output signal to the outside.

The first diagnosis unit 409 includes a first diagnostic sensor element 429, a signal amplification unit 430, a voltage monitoring unit 431, and comparison monitoring units 432 and 433. The term of "monitoring" may be also referred to as "MONIT" in the drawings.

The first diagnostic sensor element 429 is an element for diagnosing the first sensor element 501. The first diagnostic sensor element 429 is formed in the processing chip 400. The first diagnostic sensor element 429 has the same configuration as that of the first sensor element 501. The first diagnostic sensor element 429 outputs the same first detection signal as that of the first sensor element 501.

The signal amplification unit 430 is a circuit unit that receives a first detection signal from the first diagnostic sensor element 429 and amplifies the signal. The signal amplification unit 430 is a circuit unit for diagnosis having the same function as that of the signal amplification unit 424.

The voltage monitoring unit 431 receives the first detection signal output from the first sensor element 501 and the first detection signal output from the first diagnostic sensor element 429. The voltage monitoring unit 431 diagnoses the presence or absence of a failure in the first sensor element 501 by comparing voltage values which are signal values of the respective detection signals with each other.

The comparison monitoring unit 432 diagnoses the presence or absence of a failure in the signal amplification unit 424 by comparing the first detection signal output from the signal amplification unit 424 and the first detection signal output from the signal amplification unit 430 with each other.

The comparison monitoring unit 433 receives the first output signal, the second output signal, and the third output signal from the respective generation units 425 to 427, and compares the output signals. As a result, the comparison monitoring unit 433 diagnoses the presence or absence of a failure in any of the generation units 425 to 427.

The first diagnosis unit 409 controls the output of the first determination unit 428 when the voltage monitoring unit 431 and the comparison monitoring units 432 and 433 diagnose a failure. For example, the first diagnosis unit 409 changes the output of the first determination unit 428 to a first abnormality signal.

The second processor 403 has the same function as that of the first processor 402. In other words, the second circuit unit 410 includes a signal amplification unit 434, a fourth generation unit 435, a fifth generation unit 436, a sixth generation unit 437, and a second determination unit 438. The term of "fourth" may be also referred to as "4TH" in the drawings. The term of "fifth" may be also referred to as "5TH" in the drawings. The term of "sixth" may be also referred to as "6TH" in the drawings.

The signal amplification unit 434 is a circuit unit that receives a second detection signal from the second sensor element 502 and amplifies the signal. The signal amplification unit 434 outputs the processed second detection signal to each of the generation units 435 to 437.

The fourth generation unit 435 is a circuit unit that receives the second detection signal from the signal amplification unit 434 and generates a fourth output signal. The fifth generation unit 436 is a circuit unit that receives the second detection signal from the signal amplification unit 434 and generates a fifth output signal identical to the fourth output signal. The sixth generation unit 437 is a circuit unit that receives the second detection signal from the signal amplification unit 434 and generates a sixth output signal identical to the fourth output signal and the fifth output signal. Each of the generation units 435 to 437 has the same configuration. In other words, an output circuit unit of the second circuit unit 410 is a triple system. Each of the generation units 435 to 437 generates, for example, a PWM signal as an output signal.

The second determination unit 438 is a circuit unit that receives the fourth output signal, the fifth output signal, and the sixth output signal from the respective generation units 435 to 437 and determines which output signal is to be output. The second determination unit 438 takes a majority vote of the signal values of the respective output signals, and determines an output signal of the majority signal value as a signal to be output to the outside. The second determination unit 438 outputs the output signal of the majority to the outside as a sensor output (O2).

The second diagnosis unit 411 includes a second diagnostic sensor element 439, a signal amplification unit 440, a voltage monitoring unit 441, and comparison monitoring units 442 and 443.

The second diagnostic sensor element 439 is an element for diagnosing the second sensor element 502. The second diagnostic sensor element 439 is formed in the processing chip 400. The second diagnostic sensor element 439 is an element having the same configuration as that of the second sensor element 502. The second diagnostic sensor element 439 outputs the same second detection signal as that of the second sensor element 502.

The signal amplification unit 440 is a circuit unit that receives the second detection signal from the second diagnostic sensor element 439 and amplifies the signal. The signal amplification unit 440 is a circuit unit that is used for diagnosis and has the same function as that of the signal amplification unit 434.

The voltage monitoring unit 441 receives the first detection signal output from the second sensor element 502 and the second detection signal output from the second diagnostic sensor element 439. The voltage monitoring unit 441 diagnoses the presence or absence of a failure in the second sensor element 502 by comparing voltage values which are signal values of the respective detection signals with each other.

The comparison monitoring unit 442 diagnoses the presence or absence of a failure in the signal amplification unit 434 by comparing the second detection signal output from the signal amplification unit 440 with the second detection signal output from the signal amplification unit 434.

The comparison monitoring unit 443 receives the fourth output signal, the fifth output signal, and the sixth output signal from the respective generation units 435 to 437, and compares the output signals. As a result, the comparison monitoring unit 443 diagnoses the presence or absence of a failure in any one of the generation units 435 to 437.

When the voltage monitoring unit 441 and the comparison monitoring units 442 and 443 diagnose a failure, the second diagnosis unit 411 controls the output of the second determination unit 438. For example, the second diagnosis unit 411 changes the output of the second determination unit 438 to a second abnormality signal. The sensor device 1 according to the present embodiment is configured as described above.

In the configuration described above, the output circuit units of the first circuit unit 408 and the second circuit unit 410 are configured in a triple system. On the other hand, for example, when the first circuit unit 408 includes only the first generation unit 425, it is unclear whether a normal output signal is output from the first generation unit 425 until the diagnosis by the first diagnosis unit 409 is confirmed. Further, when the first circuit unit 408 has the first generation unit 425 and the second generation unit 426, when one of the first generation unit 425 and the second generation unit 426 fails, it is unknown from which of the first generation unit 425 and the second generation unit 426 a normal output signal is output.

However, when the first circuit unit 408 has three generation units 425 to 427, an output signal which is estimated to be normal can be extracted from among the three output signals, as in the majority vote described above. Therefore, redundancy can be ensured also in the first processor 402. The same effects can be obtained by the second circuit unit 410. Therefore, redundancy can be ensured also in the second processor 403.

The comparison monitoring unit 433 of the first diagnosis unit 409 may correspond to a "first comparison monitoring unit" of the present disclosure. The comparison monitoring unit 443 of the second diagnosis unit 411 may correspond to a "second comparison monitoring unit" of the present disclosure.

As a modification, the first diagnostic sensor element 429 and the second diagnostic sensor element 439 may be formed in the sensor chip 500 instead of the processing chip 400.

As a modification, each of the generation units 425 to 427 and each of the generation units 435 to 437 is not limited to a triple system. For example, those generation units may be configured as a quadruple system or a quintuple system. The multiple generation units rarely fail at the same time. Therefore, a majority vote is established when the generation unit is configured to have at least a triple system.

As a modification, the signal generated by each of the generation units 425 to 427 and 435 to 437 is not limited to the PWM signal. For example, a signal for a sent communication or a simple voltage signal may be used for the above signal.

Other Embodiments

The configurations of the sensor device 1 shown in each of the above embodiments are only examples, and the present disclosure is not limited to the configurations shown above, and other configurations capable of implementing the present disclosure may be used. For example, the electrical isolation structure by the isolation portion 404 is not limited to the examples shown in FIGS. 4, 10, and 12. For example, the processors 402 and 403 may not be partitioned at the positions separated by the isolation portion 404. The processors 402 and 403 may be disposed at positions adjacent to each other partitioned by the isolation portion 404.

The semiconductor substrate 401 is not limited to an SOI substrate. For example, the semiconductor substrate 401 may be a two-layer lamination substrate in which the second conductive layer 407 is laminated on the insulation layer 406. Since the isolation portion 404 may be formed by a semiconductor process, the semiconductor substrate 401 may be configured such that multiple trenches are provided in one silicon substrate, an insulation layer is formed on a wall surface of each trench, and a silicon layer is buried in a groove of the insulation layer. Since each of the processors 402 and 403 may be electrically separated from each other, the first processor 402 may be formed in the first conductive layer 405, and the second processor 403 may be formed in the second conductive layer 407. In this case, the insulation layer 406 serves as the isolation portion 404.

The detection target is not limited to a gear. The detection target may be a magnetized rotor in which a first magnetic pole and a second magnetic pole are alternately provided on an outer peripheral portion of a rotating body. Further, the detection target is not limited to the rotating body. As a result, the detected physical quantity is not limited to magnetism. For example, the physical quantity is pressure, acceleration, angular velocity, light, temperature, humidity, current, distortion, or the like.

The sensor device 1 shown in each of the above embodiments is mounted on a vehicle. Therefore, the present disclosure can be applied to autonomous driving of a system related to traveling, bending, or stopping such as a shift, a steering, a brake, and the like. Needless to say, the sensor device 1 is not limited to the case of being mounted on a vehicle.

The invention claimed is:

1. A sensor device comprising:
a first sensor element configured to
detect a physical quantity of a detection target, and
output a first detection signal;
a second sensor element configured to
detect the physical quantity of the detection object, and
output a second detection signal; and
a processing chip that includes
a semiconductor substrate,
a first processor that
is formed in the semiconductor substrate,
is configured to receive the first detection signal from the first sensor, and
is configured to process the first detection signal,
a second processor that
is formed in the semiconductor substrate,
is configured to receive the second detection signal from the second sensor element, and
is configured to process the second detection signal, and
a first isolation portion that
is formed in the semiconductor substrate by a semiconductor process, and
is configured to electrically isolate the first processor the second processor from each other, wherein:
the first processor includes a first processing circuit configured to process the first detection signal and a first diagnosis unit configured to self-diagnose a presence or absence of a failure in the first sensor element or the first processor;
the second processor includes a second processing circuit configured to process the second detection signal and a second diagnosis unit configured to self-diagnose a presence or absence of a failure in the second sensor element or the second processor; and
the processing chip is configured to identifiably output a first output of the first processor based on a diagnosis result of the first diagnosis unit and a second output of the second processor based on a diagnosis result of the second diagnosis unit to an outside, wherein:
the first processor further includes a second isolation portion that
is formed in the semiconductor substrate by a semiconductor process, and
is configured to electrically isolate the first processing circuit and the first diagnosis unit from each other; and
the second processor further includes a third isolation portion that is formed in the semiconductor substrate by a semiconductor process, and is configured to electrically isolate the second processing circuit and the second diagnosis unit from each other.

2. The sensor device according to claim 1, wherein:
the semiconductor substrate is a lamination substrate that includes a first conductive layer, an insulation layer formed on the first conductive layer, and a second conductive layer formed on the insulation layer;
the second conductive layer includes the first processor and the second processor are laminated;
the first isolation portion has a first trench that is provided in the second conductive layer to partition the first processor and the second processor into different regions and reach the insulation layer, and a first insulator buried in the first trench;
the second isolation portion has a second trench that is provided in the second conductive layer to partition the first processing circuit and the first diagnosis unit into different regions and reach the insulation layer, and a second insulator buried in the second trench; and
the third isolation portion has a third trench that is provided in the second conductive layer to partition the second processing circuit and the second diagnosis unit into different regions and reach the insulation layer, and a third insulator buried in the third trench.

3. The sensor device according to claim 1, wherein
the processing chip further includes:
  a first compartment portion that is formed in the semiconductor substrate, and electrically isolated from the first processor and the second processor by the first isolation portion;
  a second compartment portion that is formed in the semiconductor substrate and electrically isolated from the first processor, the second processor, and the first compartment portion by the first isolation portion; and
  a function unit that
    is formed in both of the first compartment portion and the second compartment portion,
    is configured to perform the identical function in both of the first compartment portion and the second compartment portion, and
    is different in layout between the first compartment portion and the second compartment portion.

4. The sensor device according to claim 1, wherein:
the processing chip includes a switching unit configured to
select the first output of the first processor based on the diagnosis result of the first diagnosis unit or the second output of the second processor based on the diagnosis result of the second diagnosis unit, and
output a selected output to the outside.

5. The sensor device according to claim 1, wherein:
the first processor includes
  a first generation unit configured to generate a first output signal based on the first detection signal,
  a second generation unit configured to generate a second output signal identical to the first output signal based on the first detection signal,
  a third generation unit configured to generate a third output signal identical to the first output signal and the second output signal based on the first detection signal, and
  a first determination unit configured to
    receive the first output signal, the second output signal, and the third output signal,
    select a majority of a signal value of each of the first output signal, the second output signal, and the third output signal, and
    determine an output signal of the signal value in accordance with the majority as a signal to be output to the outside,
the first diagnosis unit includes a first comparison monitoring unit configured to
  receive the first output signal, the second output signal, and the third output signal, and
  compare the first output signal, the second output signal, and the third output signal to diagnose a failure in at least one of the first generation unit, the second generation unit, and the third generation unit,
the second processor includes
  a fourth generation unit configured to generate a fourth output signal based on the second detection signal,
  a fifth generation unit configured to generate a fifth output signal identical to the fourth output signal based on the second detection signal,
  a sixth generation unit configured to generate a sixth output signal identical to the fourth output signal and the fifth output signal based on the second detection signal, and
  a second determination unit configured to
    receive the fourth output signal, the fifth output signal, and the sixth output signal, and
    select a majority of a signal value of each of the fourth output signal, the fifth output signal, and the sixth output signal to determine an output signal of the signal value in accordance with the majority as a signal to be output to the outside; and
the second diagnosis unit includes a second comparison monitoring unit configured to
  receive the fourth output signal, the fifth output signal, and the sixth output signal, and
  compare the fourth output signal, the fifth output signal, and the sixth output signal to diagnose a failure in at least one of the fourth generation unit, the fifth generation unit, and the sixth generation unit.

6. The sensor device according to claim 1, wherein:
a common power supply is supplied to the first processor and the second processor; and
a common ground is supplied to the first processor and the second processor.

7. The sensor device according to claim 6, further comprising:
a power supply terminal to which a power is supplied; and
a ground terminal to which ground is supplied, wherein:
the processing chip includes
  a power supply wiring through which the power supplied to the power supply terminal is supplied to the first processor and the second processor, and
  a ground wiring through which the ground supplied to the ground terminal is supplied to the first processor and the second processor.

8. The sensor device according to claim 6, further comprising:
a power supply terminal to which a power is supplied; and
a ground terminal to which ground is supplied, wherein:
the power supply terminal
  includes a first wire that is electrically connected to the first processor, and a second wire that is electrically connected to the second processor, and is configured to supply the power common to the first processor and the second processor through the first wire and the second wire; and the ground terminal
includes a third wire that is electrically connected to the first processor, and a fourth wire that is electrically connected to the second processor, and
is configured to supply the ground common to the first processor and the second processor through the third wire and the fourth wire.

9. The sensor device according to claim 1, further comprising:
the power supply terminal to which the power is supplied;
the ground terminal to which the ground is supplied;
a lead frame; and
a mold resin portion, wherein:
the first sensor element and the second sensor element are mounted on a first end of the lead frame;
the processing chip is mounted between the first end of the lead frame and a second end opposite to the first end;
the power supply terminal and the ground terminal are disposed adjacent to the second end of the lead frame; and
the mold resin portion seals the first sensor element, the second sensor element, the processing chip, the lead frame, a part of the power supply terminal on a side close to the second of the lead frame, and a part of the ground terminal on a side close to the second end of the lead frame.

10. The sensor device according to claim 9, wherein:
the lead frame has a front surface and a back surface;
the first sensor element and the second sensor element are mounted on the front surface of the first end of the lead frame; and
the processing chip is mounted between the first end and the second end of the front surface of the lead frame.

11. The sensor device according to claim 9, wherein:
the lead frame has a front surface and a back surface;
the first sensor element is mounted on the front surface of the first end of the lead frame;
the second sensor element is mounted on the back surface of the first end of the lead frame; and
the processing chip is mounted between the first end and the second end of the front surface of the lead frame.

12. The sensor device according to claim 1, further comprising
a fourth isolation portion that is configured to electrically isolate the first and second sensor elements from the processing chip.

* * * * *